United States Patent
Kuwana et al.

(10) Patent No.: US 11,827,972 B2
(45) Date of Patent: Nov. 28, 2023

(54) IGZO SPUTTERING TARGET

(71) Applicant: JX Nippon Mining & Metals Corporation, Tokyo (JP)

(72) Inventors: Yuhei Kuwana, Ibaraki (JP); Kozo Osada, Ibaraki (JP); Jun Kajiyama, Ibaraki (JP); Kazutaka Murai, Ibaraki (JP)

(73) Assignee: JX Metals Corporation, Tokyo (JP)

( * ) Notice: Subject to any disclaimer, the term of this patent is extended or adjusted under 35 U.S.C. 154(b) by 7 days.

(21) Appl. No.: 17/563,237

(22) Filed: Dec. 28, 2021

(65) Prior Publication Data

US 2022/0220605 A1 Jul. 14, 2022

(30) Foreign Application Priority Data

Jan. 13, 2021 (JP) .................................. 2021-003779
Dec. 23, 2021 (JP) .................................. 2021-209835

(51) Int. Cl.
*C23C 14/34* (2006.01)
*C04B 35/453* (2006.01)

(52) U.S. Cl.
CPC ........ *C23C 14/3414* (2013.01); *C04B 35/453* (2013.01)

(58) Field of Classification Search
None
See application file for complete search history.

(56) References Cited

U.S. PATENT DOCUMENTS

| 2004/0094412 A1* | 5/2004 | Navala ................ H01J 37/3455 |
| | | 204/192.12 |
| 2013/0285053 A1* | 10/2013 | Kawashima ........ C04B 35/6262 |
| | | 264/681 |
| 2020/0385853 A1 | 12/2020 | Tsukada et al. |

FOREIGN PATENT DOCUMENTS

| CN | 109874331 A | 6/2019 | |
| TW | 201439028 A | 10/2014 | |
| TW | 201634423 A | 10/2016 | |
| WO | WO-2014021334 A1 * | 2/2014 | ............. B82Y 30/00 |
| WO | WO-2017/131111 A1 | 8/2017 | |

OTHER PUBLICATIONS

Office Action in TW Application No. 111100961 dated Aug. 4, 2022, 17 pages.

* cited by examiner

*Primary Examiner* — Jason Berman
(74) *Attorney, Agent, or Firm* — MARSHALL, GERSTEIN & BORUN LLP

(57) ABSTRACT

An object of the present invention is to provide an IGZO sputtering target capable of improving uniformity for at least one property selected from the number of microcracks in the structure, the number of pores in the sintered body structure, and surface roughness.

The IGZO sputtering target according to the present invention has an oxide sintered body, the oxide sintered body comprising indium (In), gallium (Ga), zinc (Zn) and unavoidable impurities, wherein, on a surface of the oxide sintered body, a lightness difference $\Delta L^*$ satisfies $\Delta L^*<3.0$, in which the $\Delta L^*$ is obtained by subtracting lightness $Lc^*$ at a central portion on the surface from lightness $Le^*$ at a position of 10 mm from an end portion to the central portion side on the surface, and wherein the oxide sintered body has a relative density of 97.0% or more.

6 Claims, No Drawings

IGZO SPUTTERING TARGET

FIELD OF THE INVENTION

The present invention relates to an IGZO sputtering target.

BACKGROUND OF THE INVENTION

Conventionally, α-Si (amorphous silicon) has been used for TFTs (thin-film transistors) of backplanes in FPDs (flat panel displays). However, the α-Si does not provide sufficient electron mobility. In recent years, research and development of TFTs have been conducted using In—Ga—Zn—O oxide (IGZO), which has higher electron mobility than that of the α-Si. Further, some next-generation high-functional flat panel displays using IGZO-TFTs have been put into practical use and attracted attention.

Here, the IGZO films can be obtained mainly by DC sputtering of sputtering targets produced from IGZO sintered bodies, and sputtering targets capable of obtaining higher quality IGZO films have been studied (e.g., Patent Literature 1).

CITATION LIST

Patent Literatures

[Patent Literature 1] WO 2017/131111

SUMMARY OF THE INVENTION

The IGZO sintered body of the sputtering target can be produced by sintering a molded body of a desired oxide metal mixture and then cutting it to have a desired shape and size. However, even if the sintered oxide after sintering has high uniformity, the oxide sintered body cut to have the desired shape and size in the process of producing the sputtering target may have reduced uniformity for at least one property selected from the number of microcracks in the structure, the number of pores in the structure of the sintered body, and surface roughness. In such a case, there is a concern that the amount of particles generated during sputtering using the sputtering target will increase, making it difficult to obtain a high-quality IGZO film.

Therefore, an object of the present invention is to provide an IGZO sputtering target capable of improving uniformity for at least one property selected from the number of microcracks in the structure, the number of pores in the sintered body structure, and surface roughness.

As a result of intensive studies to solve the above problems of the prior arts, the present inventors have found that in the oxide sintered body obtained by sintering and cutting, differences in properties, especially in lightness L* on a surface of the sintered body, may be generated depending on positions in the sintered body. They have also found that the factor is that at least one of the number of microcracks in the structure and the pores in the structure of the oxide sintered body is locally increased at an end portion of the oxide sintered body, or the surface roughness is increased, due to processing damage during cutting of the oxide sintered body after sintering. Furthermore, they have found that as a result of the changes at the end portion, the lightness L* at the end portion is increased as compared to the lightness L* at a central portion. They have also found that excessively decreased density of the oxide sintered body to reduce the amount of cracks in the oxide sintered body easily generates nodules which are generated on the oxide sintered body and lead to deterioration of the quality of the IGZO film, and completed the present invention.

The present invention is as follows:

In an embodiment, the IGZO sputtering target according to the present invention is a sputtering target having an oxide sintered body, the oxide sintered body comprising indium (In), gallium (Ga), zinc (Zn) and unavoidable impurities, wherein, on a surface of the oxide sintered body, a lightness difference $\Delta L^*$ satisfies $\Delta L^* < 3.0$, in which the $\Delta L^*$ is obtained by subtracting lightness $Lc^*$ at a central portion on the surface from lightness $Le^*$ at a position of 10 mm from an end portion to the central portion side on the surface, and wherein the oxide sintered body has a relative density of 97.0% or more.

According to an embodiment of the present invention, it is possible to provide an IGZO sputtering target capable of improving uniformity for at least one property selected from the number of microcracks in the structure, the number of pores in the sintered body structure, and surface roughness.

DETAILED DESCRIPTION OF THE INVENTION

Hereinafter, an embodiment of the present invention (hereinafter referred to as a "present embodiment") will be described in detail, but the present invention is not limited to the present embodiment.

An IGZO sputtering target according to the present embodiment (hereinafter also referred to as a "sputtering target") has an oxide sintered body comprising indium (In), gallium (Ga), zinc (Zn), and unavoidable impurities. The sputtering target according to the present embodiment can be used to form semiconductor films, specifically TFTs (thin-film transistors) for FPDs (flat panel displays), such as organic electroluminescence (EL) and flexible displays, and transparent semiconductor films for semiconductor products.

Here, the oxide sintered body of the sputtering target according to the present embodiment is composed of a composite oxide containing $In_2O_3$—$Ga_2$—$ZnO$ as a main component.

More specifically, for example, in a composition where a target value of a Ga content and a target value of a Zn content are 100, respectively, when an In content in the oxide sintered body is 100, Ga is preferably 100±30 and Zn is preferably 100±30, in atomic number ratios. The contents of In, Ga, and Zn in the oxide sintered body can be measured by any method such as fluorescent X-ray or ICP-AES.

Further, in the present embodiment, the oxide sintered body can further contain other additive elements in addition to indium (In), gallium (Ga), and zinc (Zn), and specifically, it may contain at least one selected from the group consisting of Sn, Zr, Mg, Al, Si, Y, and Ti. The total amount of the other additive elements is preferably from 50 to 1000 ppm by mass, and more preferably from 100 to 500 ppm by mass. The total amount of the other additive elements of 1000 ppm by mass or less can provide a sintered body having a desired grain size of the structure and desired density of the sintered body. The total amount of 50 ppm by mass or more can provide a sufficient effect of adding the additive elements. The additive elements herein also include contamination as unavoidable impurities due to wear of the crushed media.

Further, in the present embodiment, the oxide sintered body preferably contains at least tin (Sn) when it further contains other additive elements, whereby the grain size of the structure and resistance to microcracks in the structure can be controlled. Further, when at least tin is contained, the tin content is preferably 1000 ppm by mass or less, and more preferably 500 ppm by mass or less.

The unavoidable impurities are generally present in raw materials for metal or metal oxide products, or unavoidably contaminated during production steps, such as media during milling of raw material powder. These impurities are originally unnecessary, but they are permitted because they are present in a minor amount and do not affect properties of the metal or metal oxide product. In the sputtering target according to the present embodiment, the total amount of unavoidable impurities is generally 1000 ppm by mass or less, and typically 500 ppm by mass or less, and more typically 200 ppm by mass or less.

In the present embodiment, on a surface of the oxide sintered body of the sputtering target, a lightness difference $\Delta L^*$ satisfies $\Delta L^* < 3.0$, in which the $\Delta L^*$ is obtained by subtracting lightness $Lc^*$ from lightness $Le^*$, and the lightness $Le^*$ is lightness at a position of 10 mm from an end portion to a central portion side on the surface, and the lightness $Lc^*$ is lightness at the central portion on the surface of the oxide sintered body.

Here, the lightness ($L^*$) belongs to one of three elements of the color system defined in JIS Z 8729. As the lightness increases, the color becomes more brilliant and brighter, approaching white. In other words, the greater the lightness of the surface of the oxide sintered body, the greater the diffuse reflection of visible light, indicating the presence of a large amount of at least one of the number of microcracks in the structure and the number of pores in the sintered body structure, or larger surface roughness. In the present embodiment, the sputtering target satisfies a lightness difference $\Delta L^*$ of $\Delta L^* < 3.0$, and there is no significant difference between the end portion and the central portion of the oxide sintered body of the sputtering target for at least one property selected from the number of microcracks in the structure, the number of pores in the sintered body structure, and the surface roughness. Therefore, the sputtering target of the present embodiment has the oxide sintered body having less processing damage and improved uniformity during the cutting process. The sputtering using the sputtering target having such an oxide sintered body would be able to form a high-quality IGZO film.

From the same point of view, in the present embodiment, it is preferable that the sputtering target satisfies a lightness difference $\Delta L^* < 2.5$, and more preferably $\Delta L^* < 2.0$.

The lightness as used herein can be measured by a simple spectral colorimeter (model #: NF 333 from NIPPON DENSHOKU INDUSTRIES, Co., Ltd.) after the surface of the oxide sintered body of the sputtering target is polished using a grinding stone having #80 to #800.

The surface of the oxide sintered body of the sputtering target, which is the target for measuring the lightness $Le^*$ and $Lc^*$, is a surface of the oxide sintered body on a side to be sputtered when the sputtering target is used. Specifically, if the oxide sintered body is, for example, disk-shaped or rectangular, the surface is a face (plane) of the oxide sintered body on a side opposite to a joined surface with a backing plate, for example, and if the oxide sintered body is cylindrical, it is an outer peripheral surface of the cylinder.

Furthermore, the lightness $Le^*$ is more specifically an arithmetic average value of values measured at three positions each spaced by 10 mm from the end portion to the central side on the surface of the oxide sintered body of the sputtering target. The end portion of the oxide sintered body as used herein refers to an end portion formed by cutting and processing the oxide sintered body after sintering, among end portions of the oxide sintered body of the sputtering target. Also, the expression "from the end portion to the central portion side" refers to a direction orthogonal to a contour of the end portion.

The lightness $Lc^*$ is more specifically an arithmetic average value of values measured at three positions at the central portion on the surface of the oxide sintered body of the sputtering target. The central portion on the surface of the oxide sintered body of the sputtering target refers to a region spaced by more than 10 mm from the end portion of the oxide sintered body (including the end portion formed by cutting and processing the oxide sintered body after sintering and the end portion that has not undergone cutting and processing) to the central portion side on the surface of the oxide sintered body of the sputtering target.

In the present embodiment, the method of causing the lightness difference $\Delta L^*$ of the oxide sintered body in the sputtering target to satisfy $\Delta L^* < 3.0$ includes reducing any processing damage during the cutting process of the oxide sintered body, specifically, suppressing a cutting speed during the cutting process and providing a finer grinding wheel. However, from the viewpoint of ensuring the productivity of the sputtering target, it is also preferable that the sintered oxide itself has strength against such processing damage during the cutting process.

The oxide sintered body having strength against the processing damage during the cutting process can be obtained by adjusting a sintering temperature of the oxide sintered body, a retention time of the maximum sintering temperature, and an atmosphere during sintering. Specifically, when the sintering temperature is relatively high, microcracks may be generated in the entire structure of the oxide sintered body. In this case, the residual stress in the sintered structure is relaxed, and the microcracks tend not to develop significantly due to damage during the cutting process, so that it is difficult to increase the difference $\Delta L^*$ between the lightness $Le^*$ near the end portion of the oxide sintered body and the lightness $Lc^*$ at the central portion of the oxide sintered body.

On the other hand, when the sintering temperature is relatively low, the grains in the structure of the oxide sintered body can be strong, which can reduce the microcracks that may be generated due to the processing damage in the entire structure during the cutting process, and which tends to reduce the difference $\Delta L^*$ between $Le^*$ near the end portion of the oxide sintered body and $Lc^*$ at the central portion of the oxide sintered body. In this case, if the grain size in the structure is smaller, the structure itself will become stronger, and the microcracks hardly develop due to the damage during the cutting process, thereby tending to reduce the difference $\Delta L^*$ between $Le^*$ near the end portion of the oxide sintered body and $Lc^*$ at the central portion of the oxide sintered body.

In addition, when the sintering temperature is moderate, the entire structure of the sintered oxide can be free of cracks or very few if any. However, in this case, the residual stress caused by the sintering process would be present in the structure of the sintered body, so that the microcracks tend to develop due to the damage during the cutting process. As a result, the difference $\Delta L^*$ between the lightness $Le^*$ near the end portion of the target and the lightness $Lc^*$ at the central portion may be increased.

Next, we will describe how to improve the strength against processing damage during the cutting process by adjusting the retention time of the maximum sintering temperature. For the oxide sintered body, as the retention time of the maximum sintering temperature is longer, more microcracks can be generated in the entire structure after sintering. However, when the retention time is relatively long, the difference ΔL* between the lightness Le* near the end portion of the oxide sintered body and the lightness Lc* at the central portion of the oxide sintered body is difficult to be increased, even if the microcracks develop due to the damage during the cutting process.

When the retention time is relatively short, the generation of cracks in the entire structure can be reduced, and the difference ΔL* between Le* near the end portion of the oxide sintered body and Lc* at the central portion of the oxide sintered body tends to be decreased even after the cutting process.

Further, when the retention time is moderate, there are no or very few cracks, if any, in the entire structure of the oxide sintered body after sintering. However, in this case, the residual stress caused by the sintering process would be present in the structure of the sintered body, so that the microcracks tend to develop due to the damage during the cutting process. As a result, the difference ΔL* between the lightness Le* near the end portion of the target and the lightness Lc* in the central portion may be increased.

Next, the sintering atmosphere when obtaining the oxide sintered body is preferably an oxygen atmosphere. The oxygen atmosphere tends to increase sinterability and to increase the lightness difference ΔL* as compared with sintering in an air atmosphere.

Further, the oxide sintered body having strength against the processing damage during the cutting process can be obtained by adjusting density (relative density) of the structure of the sintered body. In general, lower density of the sputtering target may cause generation of nodules. For the IGZO target, if the density of the oxide sintered body is too high, the local stress in the structure is not relaxed and cracks tend to develop, although the mechanism is not revealed. On the other hand, if the density is too low, the microcracks are difficult to develop, but a concern about the generation of nodules will be increased.

That is, in the present embodiment, the relative density is 97.0% or more, and preferably 98.0% or more, in terms of suppressing the generation of nodules. On the other hand, the relative density is preferably 99.3% or less, in terms of suppressing the development of microcracks The relative density is obtained by a ratio of the Archimedean density to the theoretical density determined by the composition.

As used herein, the theoretical density as described above is a value of density calculated from the theoretical density of oxides of elements excluding oxygen in each constituent element of the oxide sintered body of the sputtering target. The theoretical density is calculated by conducting a component analysis of the oxide sintered body and using the resulting oxide mass ratio (% by mass) determined by conversion from an atomic ratio (at %) of each of the constituent elements In, Ga, and Zn to the total 100 at % of In, Ga, and Zn, and the density of each of $In_2O_3$, $Ga_2O_3$, and ZnO. More particularly, the theoretical density is calculated from the equation: theoretical density (g/cm$^3$)=(7.18× $W_{In2O3}$+5.95×$W_{Ga2O3}$+5.61×$W_{ZnO}$)/100, in which the density of $In_2O_3$ itself is 7.18 (g/cm$^3$), the density of $Ga_2O_3$ itself is 5.95 (g/cm$^3$), and the density of ZnO itself is 5.61 (g/cm$^3$), and $W_{In2O3}$ (% W by mass) is a mass ratio of $In_2O_3$, the $W_{Ga2O3}$ (% by mass) is a mass ratio of $Ga_2O_3$, and the $W_{ZnO}$ (% by mass) is a mass ratio of ZnO.

The relative density is based on the theoretical density calculated on the assumption that the sintered body of the sputtering target is a mixture of $In_2O_3$, $Ga_2O_3$, and ZnO, and a true value of the density of the sintered body of interest may be higher than the theoretical density as described above. Therefore, the relative density herein may be more than 100%.

The relative density of the oxide sintered body of the sputtering target according to the present embodiment can be controlled in the above range by adjusting the maximum sintering temperature, sintering retention time, and sintering atmosphere.

In the present embodiment, the grain size of the structure of the oxide sintered body is preferably 1.5 μm or more and 15 μm or less, and even more preferably 3.0 μm or more and 10 μm or less. If the grain size of the structure is larger, such as more than 15 μm, coarse particles may be generated during sputtering. If the grain size of the structure is less than 1.5 μm, the sintering may be become insufficient, and any sufficient density may not be obtained.

The grain size of the structure is measured by a chord method. To measure the grain size of the structure, a sample for observation was first cut from the target, a surface of the cut sample was mirror-polished, and photographs of the surface of the mirror-polished sample were photographed with a scanning electron microscope (SEM) in five fields of view at magnifications of 1000 times. Two straight lines were drawn on each image of the photographs, and an arithmetic average value of lengths of the straight lines intersecting the crystal grains was measured and determined to be the grain size (a crystal grain size).

The grain size of the structure of the oxide sintered body measured by the chord method can be controlled by adjusting the maximum sintering temperature, sintering retention time, and sintering atmosphere.

Here, in the present embodiment, the oxide sintered body can be produced as a part of the sputtering target, by being joined by a backing plate and a bonding material as needed. The oxide sintered body in the sputtering target may have a circular flat plate shape, a rectangular flat plate shape, or a cylindrical shape.

The oxide sintered body in the sputtering target can have a thickness of 18 mm or less, and preferably 15 mm or less. The thickness is preferably 3 mm or more, and more preferably 6 mm or more. The thickness of 3 mm or more can allow the target to be used for a longer period of time, reduce a downtime of a sputtering device and improve productivity. If the thickness of the target is too thick, it tends to be difficult to obtain sufficient density during sintering. Therefore, the thickness is preferably 18 mm or less.

A method for producing the sputtering target according to the present embodiment will be described.

The sputtering target according to the present embodiment can be produced through the following steps: a mixing and milling step for raw materials, a granulation step, a molding step, and a sintering step.

In the mixing and milling step, indium oxide ($In_2O_3$) powder, gallium oxide ($Ga_2O_3$) powder, and zinc oxide (ZnO) powder are prepared as raw material powder.

It is preferable that the indium oxide powder has a median diameter (D50) of from 0.5 to 3 μm, and a specific surface area of from 4 to 10 m$^2$/g, and the gallium oxide powder has a median diameter (D50) of from 0.5 to 4 μm, and a specific surface area of from 6 to 30 m$^2$/g, and the zinc oxide powder has a median diameter (D50) of from 0.1 to 2 μm, and a specific surface area of from 2 to 20 m$^2$/g.

Each raw material powder is then weighed so as to achieve a desired composition ratio, and then mixed and milled. There are various milling methods depending on desired grain sizes and material to be milled, including wet or dry ball mills, vibration mills, bead mills, and the like. In order to obtain uniform and fine crystal grains, the bead mill mixing method is preferred because it has a higher disintegration efficiency of aggregates in a short period of time, and provides good dispersion of additives.

Subsequently, in the granulation step, the finely milled slurry is granulated. The purpose of this step is to improve fluidity of the powder by granulation, and uniformly fill a mold with the powder during press molding in the next step, thereby obtaining a uniform molded body. There are various methods of granulation, and one method of obtaining granulated powder suitable for press molding is to use a spray dryer. In this method, the powder is prepared into a slurry, dispersed as droplets in hot air, and dried instantaneously, and spherical granulated powder having 10 to 500 μm can be continuously obtained.

For the drying with the spray dryer, it is important to control an inlet temperature and an outlet temperature of the hot air. A larger difference between the temperatures at the inlet and outlet increases a drying volume per unit time, thereby improving productivity. However, if the inlet temperature is too high, the powder and added binder may be altered by the heat, and desired properties may not be obtained. If the outlet temperature is too low, the granulated powder may not be sufficiently dried.

Further, a binder such as polyvinyl alcohol (PVA) can be added to the slurry and contained in the granulated powder to improve the strength of the molded body. The PVA can be added in an amount of from 50 to 250 cc/kg of an aqueous solution containing 6% by mass of PVA to the raw powder. Further, a plasticizer suitable for the binder can also be added to adjust crushing strength of the granulated powder during press molding. A small amount of water can also be added to the resulting granulated powder to moisten it, thereby improving the strength of the molded body.

Subsequently, in the molding step, the granulated powder is maintained at, for example, a pressure of 1 ton/cm$^2$ or higher for 1 to 3 minutes, by a mold pressing or a cold hydrostatic pressing (CIP), to obtain a molded body.

In the subsequent sintering step, for example, an electric furnace is used, and in addition to the atmospheric pressure sintering method, pressure sintering methods such as hot pressing, oxygen pressing and hot hydrostatic pressing can also be employed. However, it is preferable to use the atmospheric pressure sintering method from the viewpoints of lower production cost, possibility of mass production, and easy production of large sintered bodies.

For the sintering atmosphere in the sintering step, oxygen is preferably contained in the atmosphere. More preferably, the sintering atmosphere may be an oxygen atmosphere. The containing of oxygen can easily provide bulk resistance of the oxide sintered body in a desired range.

In the atmospheric pressure sintering method, the molded body is generally fired in air to sinter it. When oxygen is introduced and sintering is carried out, a flow rate of oxygen is preferably from 5 to 2000 L/min.

The maximum sintering temperature in the sintering step can be from 1200 to 1500° C., and preferably from 1220 to 1360° C. The maximum sintering temperature in such a range can allow the lightness difference ΔL* to easily satisfy ΔL*<3.0 and the relative density of the oxide sintered body to be easily set to a predetermined range.

The retention time at the maximum sintering temperature can be from 5 to 100 hours, and preferably from 10 to 100 hours, and more preferably from 20 to 80 hours. The retention time at the maximum sintering temperature in such a range can allow the lightness difference ΔL* to easily satisfy ΔL*<3.0 and the relative density of the oxide sintered body to be easily set to the predetermined range.

Further, a temperature increasing rate during the sintering is preferably 0.1 to 5° C./min in a temperature range of 1000° C. or higher, and more preferably from 0.3 to 3° C./min, and even more preferably 0.5 to 2° C./min. A temperature increasing rate of more than 5° C./min in that temperature range is not desirable in terms of process stability during mass production. Also, a temperature increasing rate of less than 0.1° C./min in that temperature range is not desirable in terms of productivity.

The temperature increasing rate beyond the above defined temperature range is not particularly limited, but the sintering may be carried out at any temperature increasing rate.

Furthermore, the temperature of the molded body (sintered body) after sintering can be decreased in the temperature range of 600° C. or higher at a temperature decreasing rate of 10° C./min or less. The temperature decreasing rate of 10° C./min or less can suppress cracking of the sintered body due to thermal stress. Here, the reason why the temperature range in which the temperature decreasing rate is 10° C./min or less is 600° C. or higher is that thermal stress tends to increase in the sintered body at 600° C. or higher during the decreasing of the temperature.

The temperature decreasing rate may preferably be 5° C./min or less, and more preferably 3° C./min or less. The temperature decreasing rate may preferably be 0.1° C./min or more, and more preferably 0.5° C./min or more, in terms of productivity.

The temperature decreasing rate beyond the above defined temperature range is not limited, but the sintering can be carried out at any temperature decreasing rate.

In the method for producing the sputtering target according to the present embodiment, the sintered body obtained through the above sintering step may optionally be processed into a desired shape by means of a surface grinder, a cylindrical grinder, machining or other processing machine to produce a sputtering target. The shape of the sputtering target is not particularly limited. For example, the sputtering target can have a disk-shape, a rectangular shape, a cylindrical shape of the like. The sputtering targets may optionally be joined by a backing plate and a bonding material.

It should be noted that the oxide sintered body can be cut by using a cutting wheel grinding stone. The wheel grinding stone may preferably be made of a metal material, and preferably have a grain size of #60 to #400, and more preferably #80 to #280. If the shape of the oxide sintered body is cylindrical, the cutting can be carried out by cutting the oxide sintered body from the outer peripheral surface at a rate of 0.1 to 10 mm/min while rotating the oxide sintered body around its axis at, for example, 5 to 200 rpm. If the shape of the oxide sintered body is disk-shaped or rectangular, the cutting can be carried out by cutting the oxide sintered body from the surface at a rate of 0.1 to 100 mm/min.

While the present embodiments according to the present invention have been described, the sputtering target according the present invention are not limited to the above embodiment, and it can be modified as needed.

EXAMPLES

The present invention is described in more detail by means of Examples below, but the present invention is not limited in any way to the following Examples.

(Production of Sputtering Target)

Indium oxide ($In_2O_3$) powder, gallium oxide ($Ga_2O_3$) powder, and zinc oxide (ZnO) powder were prepared as raw material powders for oxide sintered bodies in sputtering targets according to Examples 1 to 31 and Comparative Examples 1 to 9.

In the sputtering targets according to Examples 1, 3-7, 9, 11, 13-20, and 22-30, and Comparative Examples 1, 2, 4, 5, 8, and 9, the indium oxide powder had a median diameter (D50) of 1.6 μm and a specific surface area of 4.2 $m^2$/g, and the gallium oxide powder had a median diameter (D50) of 1.7 μm and a specific surface area of 11.7 $m^2$/g, and the gallium oxide powder had a median diameter (D50) of 1.7 μm and a specific surface area of 11.7 $m^2$/g, and the zinc oxide powder had a median diameter (D50) of 0.6 μm and a specific surface area of 3.9 $m^2$/g.

In the sputtering targets according to Examples 2, 8, 10, 12, 21, and 31, and Comparative Examples 3, 6, and 7, the indium oxide powder had a median diameter (D50) of 1.4 μm and a specific surface area of 5.0 $m^2$/g, the gallium oxide powder had a median diameter (D50) of 1.7 μm and a specific surface area of 11.7 $m^2$/g, and the zinc oxide powder had a median diameter (D50) of 0.6 μm and a specific surface area of 3.9 $m^2$/g. In Examples 2, 8, 10, 12, 21, and 31 and Comparative Examples 3, 6, and 7, the tin oxide ($SnO_2$) powder was also contained as a raw material in the amounts listed in Table 1 (tin atom content in Table 1), and tin oxide powder had a median diameter (D50) of 1.5 μm and a specific surface area of 5.7 $m^2$/g.

Each raw material powder was weighed to have the composition ratio (atomic ratio) listed in Table 1, and then mixed and milled in a wet process by means of a bead mill. Each raw material powder in the milled slurry had a grain size of 0.6 μm. The milled slurry was then granulated. For the granulation, the powder was made into a slurry and dispersed as droplets in hot air using a spray dryer, and instantaneously dried to obtain continuously spherical granulated powder having 49 μm.

Next, for Examples 5, 11-14, 16-21, 23, and 25-31, and Comparative Examples 3-7, the granulated powder was filled in a mold, and a pressure of 1800 kgf/$cm^2$ was applied and maintained for 1 minute to form a disc-shaped molded body having a diameter of 130 mm and a thickness of 21 mm. For Examples 3, 15, and 24, and Comparative Examples 1, 2, and 9, the granulated powder was filled in the mold, and a pressure of 1800 kgf/$cm^2$ was applied and maintained for 1 minute to form a cylindrical molded body having an axial length of 1600 mm, an outer diameter of 197 mm, and an inner diameter of 157 mm. For Examples 1, 2, 4, 6-10, and 22, and Comparative Example 8, the granulated powder was filled in a mold, cold-pressed, and then molded under a pressure of 1800 kgf/$cm^2$ for 1 minute to obtain a rectangular-shaped molded body having a width of 550 mm, a length of 595 mm, and a thickness of 16 mm.

The molded bodies were then sintered in the atmospheres shown in Table 1 using an electric furnace to obtain sintered oxide bodies. Specifically, the temperature of each molded body was increased under the conditions shown in Table 1, and then sintered at the sintering temperature for the time shown in Table 1. In addition, the temperature increasing rate from 1000° C. to the maximum temperature was 1° C./min, and the temperature decreasing rate was 1.5° C./min until the temperature was decreased to 600° C. after the completion of maintaining the maximum temperature.

Subsequently, for Examples 5, 11-14, 16-21, 23, and 25-31, and Comparative Examples 3-7, each of the resulting oxide sintered bodies was processed into a rectangular shape having a diameter of 100 mm and a thickness of 15 mm. Each oxide sintered body was cut using a metal #140 cutting wheel grinding stone and applying the grinding stone at a rate of 50 mm/min from the surface of the oxide sintered body.

For Examples 3, 15, and 24 and Comparative Examples 1, 2, and 9, the resulting oxide sintered body was processed into a cylindrical shape having an axial length of 50 mm, an outer diameter of 153 mm, and an inner diameter of 135 mm. The oxide sintered body was cut using a metal #140 cutting wheel grinding stone and applying the grinding stone at a rate of 1 mm/min from the surface of the oxide sintered body while rotating the oxide sintered body at 20 rpm in the axial direction.

For Examples 1, 2, 4, 6-10, and 22, and Comparative Example 8, the resulting oxide sintered body was processed into a rectangular shape having a width of 450 mm, a length of 450 mm, and a thickness of 10 mm. The oxide sintered body was cut using a metal #140 cutting wheel grinding stone and applying the grinding stone at a rate of 50 mm/min from the surface of the oxide sintered body.

The sintered oxide bodies after processing as described above were surface-finished with abrasives having the grain sizes shown in Table 1. The surface-finished oxide sintered body was subjected to evaluations as described below.

In the sintering of each molded body, an electric furnace having a furnace volume of 2.2 $m^3$ (denoted as Furnace (L) in Table 1) and an electric furnace having a furnace volume of 0.06 $m^3$ (denoted as Furnace (S) in Table 1) were used.

TABLE 1

| | Composition | | Sintering Conditions | | | | | |
|---|---|---|---|---|---|---|---|---|
| | | Other Element | Maximum Temperature (° C.) | Retention Time (h) | Atmosphere | Furnace | Surface Finish | Shape |
| Example 1 | In:Ga:Zn = 100:100:100 | — | 1430 | 20 | Oxygen | Furnace (L) | #80 | Rectanglar |
| Example 2 | In:Ga:Zn = 100:100:102 | Sn = 380 ppm | 1370 | 20 | Oxygen | Furnace (L) | #400 | Rectanglar |
| Example 3 | In:Ga:Zn = 100:100:102 | — | 1360 | 20 | Oxygen | Furnace (L) | #400 | Cylindrical |
| Example 4 | In:Ga:Zn = 100:100:102 | — | 1360 | 20 | Oxygen | Furnace (L) | #400 | Rectanglar |
| Example 5 | In:Ga:Zn = 100:100:102 | — | 1360 | 5 | Air | Furnace (S) | #80 | Disk |
| Example 6 | In:Ga:Zn = 100:100:102 | — | 1320 | 20 | Oxygen | Furnace (L) | #400 | Rectanglar |
| Example 7 | In:Ga:Zn = 100:100:102 | — | 1300 | 40 | Oxygen | Furnace (L) | #80 | Rectanglar |
| Example 8 | In:Ga:Zn = 100:100:102 | Sn = 380 ppm | 1300 | 40 | Oxygen | Furnace (L) | #80 | Rectanglar |
| Example 9 | In:Ga:Zn = 100:100:102 | — | 1300 | 80 | Oxygen | Furnace (L) | #80 | Rectanglar |
| Example 10 | In:Ga:Zn = 100:100:102 | Sn = 380 ppm | 1300 | 80 | Oxygen | Furnace (L) | #80 | Rectanglar |

TABLE 1-continued

| | Composition | | Sintering Conditions | | | | | |
|---|---|---|---|---|---|---|---|---|
| | | Other Element | Maximum Temperature (° C.) | Retention Time (h) | Atmosphere | Furnace | Surface Finish | Shape |
| Example 11 | In:Ga:Zn = 100:100:102 | — | 1290 | 80 | Air | Furnace (S) | #400 | Disk |
| Example 12 | In:Ga:Zn = 100:100:102 | Sn = 380 ppm | 1290 | 80 | Air | Furnace (S) | #80 | Disk |
| Example 13 | In:Ga:Zn = 100:100:102 | — | 1290 | 20 | Air | Furnace (S) | #80 | Disk |
| Example 14 | In:Ga:Zn = 100:100:102 | — | 1270 | 80 | Oxygen | Furnace (S) | #80 | Disk |
| Example 15 | In:Ga:Zn = 100:100:102 | — | 1270 | 40 | Oxygen | Furnace (L) | #400 | Cylindrical |
| Example 16 | In:Ga:Zn = 100:100:102 | — | 1240 | 20 | Oxygen | Furnace (S) | #80 | Disk |
| Example 17 | In:Ga:Zn = 100:100:102 | — | 1220 | 20 | Oxygen | Furnace (S) | #80 | Disk |
| Example 18 | In:Ga:Zn = 100:100:102 | — | 1320 | 20 | Oxygen | Furnace (S) | #80 | Disk |
| Example 19 | In:Ga:Zn = 100:100:102 | — | 1270 | 40 | Oxygen | Furnace (S) | #80 | Disk |
| Example 20 | In:Ga:Zn = 100:100:102 | — | 1240 | 40 | Oxygen | Furnace (S) | #80 | Disk |
| Example 21 | In:Ga:Zn = 100:100:102 | Sn = 380 ppm | 1240 | 20 | Oxygen | Furnace (S) | #400 | Disk |
| Example 22 | In:Ga:Zn = 100:100:102 | — | 1350 | 40 | Oxygen | Furnace (L) | #400 | Rectanglar |
| Example 23 | In:Ga:Zn = 100:100:102 | — | 1320 | 40 | Oxygen | Furnace (L) | #400 | Disk |
| Example 24 | In:Ga:Zn = 100:100:102 | — | 1330 | 40 | Air | Furnace (L) | #400 | Cylindrical |
| Example 25 | In:Ga:Zn = 100:101:100 | — | 1360 | 20 | Oxygen | Furnace (S) | #400 | Disk |
| Example 26 | In:Ga:Zn = 100:101:100 | — | 1300 | 20 | Oxygen | Furnace (S) | #400 | Disk |
| Example 27 | In:Ga:Zn = 100:102:100 | — | 1360 | 20 | Oxygen | Furnace (L) | #400 | Disk |
| Example 28 | In:Ga:Zn = 100:102:100 | — | 1300 | 20 | Oxygen | Furnace (L) | #400 | Disk |
| Example 29 | In:Ga:Zn = 100:93:119 | — | 1360 | 20 | Oxygen | Furnace (L) | #400 | Disk |
| Example 30 | In:Ga:Zn = 100:93:119 | — | 1300 | 20 | Oxygen | Furnace (L) | #400 | Disk |
| Example 31 | In:Ga:Zn = 100:100:50 | Sn = 380 ppm | 1360 | 20 | Oxygen | Furnace (L) | #400 | Disk |
| Comp. 1 | In:Ga:Zn = 100:100:102 | — | 1320 | 20 | Air | Furnace (L) | #400 | Cylindrical |
| Comp. 2 | In:Ga:Zn = 100:100:102 | — | 1290 | 20 | Air | Furnace (S) | #400 | Cylindrical |
| Comp. 3 | In:Ga:Zn = 100:100:102 | Sn = 380 ppm | 1270 | 40 | Oxygen | Furnace (S) | #80 | Disk |
| Comp. 4 | In:Ga:Zn = 100:100:102 | — | 1270 | 20 | Oxygen | Furnace (S) | #80 | Disk |
| Comp. 5 | In:Ga:Zn = 100:100:102 | — | 1240 | 80 | Oxygen | Furnace (S) | #80 | Disk |
| Comp. 6 | In:Ga:Zn = 100:100:102 | Sn = 380 ppm | 1240 | 80 | Oxygen | Furnace (S) | #80 | Disk |
| Comp. 7 | In:Ga:Zn = 100:100:102 | Sn = 380 ppm | 1220 | 20 | Oxygen | Furnace (S) | #80 | Disk |
| Comp. 8 | In:Ga:Zn = 100:100:102 | — | 1310 | 20 | Air | Furnace (L) | #80 | Rectanglar |
| Comp. 9 | In:Ga:Zn = 100:100:102 | — | 1350 | 20 | Air | Furnace (L) | #400 | Cylindrical |

Each of the resulting oxide sintered bodies was evaluated as follows. The following evaluation results are shown in Table 2.

(1) Density and Relative Density of Oxide Sintered Body

In accordance with JIS R 1634, the bulk density was calculated from the volume and dry weight of each sintered body, which were calculated by the Archimedes method using the following equation, and then divided by the theoretical density to obtain the relative density.

Volume of sintered body=(hydrate weight−weight in water)/density of water.

The theoretical density of the sintered body was calculated from the equation as described below, using the mass ratio of $In_2O_3$, $W_{In2O3}$ (% by mass), the mass ratio of $Ga_2O_3$, $WGa_2O_3$ (% by mass), and the mass ratio of ZnO, $W_{ZnO}$ (% by mass), which were determined by conversion from each atomic ratio (at %) of the constituent elements In, Ga, and Zn relative to the total 100 at % of In, Ga, and Zn, as well as the density of $In_2O_3$ itself of 7.18 (g/cm³), the density of $Ga_2O_3$ itself of 5.95 (g/cm³), and the density of ZnO itself of 5.61 (g/cm³):

Theoretical density (g/cm³)=(7.18×$W_{IN2O3}$+5.95× $W_{Ga2O3}$+5.61×$W_{ZnO}$)/100

(2) Structure Grain Sze of Oxide Sintered Body Measured by Chord Method

For the structure grain size by the chord method, a sample for observation was cut out from the oxide sintered body after surface finishing with abrasives having the grain size shown in Table 1, and the surface of the cut sample was mirror-polished. Surface microphotographs of the mirror-polished sample were taken using a scanning electron microscope (SEM) in five fields at magnifications of 1000 times, and the crystal grain sizes (the structure grain sizes) were calculated in multiple fields of view (five fields) in an evaluation method of the chord method as an average value. In the chord method, two straight lines having any length were drawn on each of the surface microphotographs, the length of the straight line is divided by the number of grains crossed by the straight line, and its value is converted by applying it to the scale of the surface microphotograph to calculate the crystal grain size of the arithmetic average based on the values obtained from the ten straight lines.

(3) Lightness Le* and Lc*

Lightness Le* and Lc* of the oxide sintered body whose surface was finished with the abrasive having the grain sizes shown in Table 1 were measured using a simple spectral colorimeter (NF 333, from NIPPON DENSHOKU INDUSTRIES Co., Ltd.).

TABLE 2

| | Sintered Body Density (g/cm³) | Relative Density (%) | Structure Grain Size (μm) | Lightness Le* | Lightness Lc* | Lightness Difference ΔL* |
|---|---|---|---|---|---|---|
| Example 1 | 6.33 | 98.7 | 16.0 | 65.5 | 65.5 | 0.0 |
| Example 2 | 6.33 | 98.9 | 7.1 | 68.1 | 68.9 | 0.0 |
| Example 3 | 6.33 | 98.9 | 7.0 | 66.0 | 66.0 | 0.0 |
| Example 4 | 6.33 | 98.8 | 9.1 | 66.7 | 66.8 | 0.1 |
| Example 5 | 6.32 | 98.8 | 4.8 | 62.9 | 60.9 | 2.0 |

TABLE 2-continued

| | Sintered Body Density (g/cm³) | Relative Density (%) | Structure Grain Size (μm) | Lightness Le* | Lightness Lc* | Lightness Difference ΔL* |
|---|---|---|---|---|---|---|
| Example 6 | 6.33 | 98.9 | 7.9 | 66.0 | 67.1 | 1.1 |
| Example 7 | 6.34 | 99.0 | 6.1 | 66.4 | 66.4 | 0.0 |
| Example 8 | 6.36 | 99.3 | 5.1 | 64.3 | 64.4 | 0.1 |
| Example 9 | 6.33 | 98.9 | 6.7 | 68.4 | 68.4 | 0.0 |
| Example 10 | 6.33 | 98.9 | 5.6 | 65.4 | 65.0 | 0.4 |
| Example 11 | 6.34 | 99.0 | 5.2 | 63.3 | 64.0 | 0.7 |
| Example 12 | 6.35 | 99.1 | 4.5 | 63.3 | 62.9 | 0.4 |
| Example 13 | 6.30 | 98.3 | 4.2 | 66.1 | 64.4 | 1.7 |
| Example 14 | 6.33 | 98.8 | 5.8 | 66.1 | 65.6 | 0.5 |
| Example 15 | 6.34 | 99.0 | 3.7 | 51.2 | 50.9 | 0.2 |
| Example 16 | 6.30 | 98.4 | 3.8 | 70.8 | 71.1 | 0.3 |
| Example 17 | 6.23 | 97.3 | 2.0 | 75.5 | 75.2 | 0.3 |
| Example 18 | 6.33 | 98.9 | 7.9 | 66.4 | 66.0 | 0.4 |
| Example 19 | 6.34 | 99.0 | 5.4 | 62.1 | 61.4 | 0.7 |
| Example 20 | 6.35 | 99.2 | 3.8 | 67.3 | 64.4 | 2.9 |
| Example 21 | 6.30 | 98.4 | 3.8 | 69.6 | 70.6 | 1.0 |
| Example 22 | 6.33 | 98.9 | 6.1 | 65.1 | 65.3 | 0.3 |
| Example 23 | 6.33 | 98.9 | 6.1 | 64.3 | 65.1 | 0.8 |
| Example 24 | 6.32 | 98.7 | 4.0 | 53.5 | 54.8 | 1.3 |
| Example 25 | 6.32 | 98.7 | 11.8 | 68.8 | 69.4 | 0.6 |
| Example 26 | 6.30 | 98.3 | 10.5 | 64.6 | 66.0 | 1.4 |
| Example 27 | 6.31 | 98.6 | 7.4 | 70.8 | 71.0 | 0.2 |
| Example 28 | 6.32 | 98.7 | 8.8 | 72.4 | 72.6 | 0.2 |
| Example 29 | 6.29 | 98.7 | 2.0 | 51.7 | 52.8 | 1.1 |
| Example 30 | 6.26 | 98.1 | 1.7 | 60.1 | 61.4 | 1.3 |
| Example 31 | 6.34 | 97.2 | 3.8 | 66.5 | 67.3 | 0.8 |
| Comp. 1 | 6.32 | 98.6 | 5.0 | 52.0 | 59.0 | 7.0 |
| Comp. 2 | 6.34 | 99.0 | 4.8 | 55.0 | 49.0 | 6.0 |
| Comp. 3 | 6.36 | 99.4 | 5.1 | 60.9 | 49.3 | 11.6 |
| Comp. 4 | 6.35 | 99.2 | 3.9 | 65.7 | 59.9 | 5.8 |
| Comp. 5 | 6.35 | 99.2 | 4.3 | 66.0 | 60.0 | 6.0 |
| Comp. 6 | 6.35 | 99.2 | 4.0 | 65.0 | 59.5 | 5.5 |
| Comp. 7 | 6.17 | 96.3 | 1.6 | 78.3 | 79.1 | 0.8 |
| Comp. 8 | 6.34 | 99.1 | 5.1 | 62.0 | 57.7 | 4.3 |
| Comp. 9 | 6.33 | 98.9 | 4.1 | 52.1 | 56.0 | 3.9 |

As shown in Table 2, each value of lightness Le*, lightness Lc*, lightness difference ΔL*, and relative density of each oxide sintered body could be controlled to the desired range, by sintering each molded body of each raw material for obtaining each oxide sintered body under a higher oxygen partial pressure, adjusting the sintering temperature, sintering time, sintering atmosphere, temperature increasing and decreasing rates, carrying out annealing after sintering, and tuning each composition.

Examples 1 to 31, where the lightness difference ΔL* and the relative density of the oxide sintered body were controlled to the defined range, could provide IGZO sputtering targets with improved uniformity for at least one property selected from the number of microcracks in the structure, the number of pores in the sintered body structure, and the surface roughness, whereby high quality IGZO films could be obtained.

INDUSTRIAL AVAILABILITY

According to the present invention, it is possible to provide an IGZO sputtering target capable of improving uniformity for at least one property selected from the number of microcracks in the structure, the number of pores in the sintered structure, and surface roughness.

The invention claimed is:

1. A sputtering target having an oxide sintered body, the oxide sintered body comprising indium (In), gallium (Ga), zinc (Zn), and unavoidable impurities,
    wherein, on a surface of the oxide sintered body, an absolute value of a lightness difference ΔL* satisfies ΔL*<3.0, in which the ΔL* is obtained by subtracting lightness Lc* at a central portion on the surface from lightness Le* at a position of 10 mm from an end portion to the central portion side on the surface,
    wherein the oxide sintered body has a relative density of 97.0% or more; and,
    wherein the oxide sintered body has at least a size such that a measurement position of Le* is located outside a measurement position of Lc*.

2. The IGZO sputtering target according to claim 1, wherein the oxide sintered body has a grain size in a structure of from 1.5 μm to 15 μm.

3. The IGZO sputtering target according to claim 1, wherein the relative density of the oxide sintered body is 99.3% or less.

4. The IGZO sputtering target according to claim 1, wherein the oxide sintered body has a circular flat plate shape, a rectangular flat plate shape, or a cylindrical shape.

5. The IGZO sputtering target according to claim 1, wherein when an In content in the oxide sintered body is 100, a Ga content in the anode is 70 to 130 and a Zn content in the anode is 70 to 130 in atomic number ratio with respect to the In content.

6. The IGZO sputtering target according to claim 1, wherein the oxide sintered body has a thickness of 15 mm or less.

* * * * *